(12) United States Patent
Kataoka et al.

(10) Patent No.: US 9,673,141 B2
(45) Date of Patent: Jun. 6, 2017

(54) MOUNTING MEMBER, ELECTRONIC COMPONENT, AND METHOD FOR MANUFACTURING MODULE

(71) Applicant: CANON KABUSHIKI KAISHA, Tokyo (JP)

(72) Inventors: Ichiro Kataoka, Kawasaki (JP); Osamu Hamamoto, Isehara (JP); Kazuya Notsu, Yokohama (JP); Koji Tamura, Kawasaki (JP); Kunihiko Minegishi, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 132 days.

(21) Appl. No.: 14/636,850

(22) Filed: Mar. 3, 2015

(65) Prior Publication Data
US 2015/0255383 A1  Sep. 10, 2015

(30) Foreign Application Priority Data

Mar. 5, 2014  (JP) .................................. 2014-043113

(51) Int. Cl.
*H05K 7/00* (2006.01)
*H01L 23/498* (2006.01)
(Continued)

(52) U.S. Cl.
CPC ........ *H01L 23/49838* (2013.01); *H01L 24/85* (2013.01); *H01L 23/49811* (2013.01);
(Continued)

(58) Field of Classification Search
CPC ................. H05K 1/0204; H05K 1/111; H05K 2201/094; H05K 2201/09781; H05K 2201/10719; H05K 2201/10727; H05K 2203/0465; H05K 3/3436; H01L 2924/00014; H01L 2224/48091; H01L 2924/181; H01L 2224/45099; H01L 2924/00012; H01L 2224/04
See application file for complete search history.

(56) References Cited

U.S. PATENT DOCUMENTS 5,656,550 A  8/1997 Tsuji
6,486,551 B1  11/2002 Sato
(Continued)

FOREIGN PATENT DOCUMENTS

JP   2007-88190 A   4/2007
JP   2012-49323 A   3/2012

*Primary Examiner* — Yuriy Semenenko
(74) *Attorney, Agent, or Firm* — Canon USA, Inc. IP Division (57) ABSTRACT

A mounting member includes a plurality of internal connecting portions, each of which is electrically connected to an electronic device, and a plurality of external connecting portions, each of which is soldered, wherein the plurality of external connecting portions include a first connecting portion in communication with at least any of the plurality of internal connecting portions, and a second connecting portion different from the first connecting portion, and surfaces of the first connecting portion and the second connecting portion include gold layers, and a thickness of the gold layer of the second connecting portion is smaller than a thickness of the gold layer of the first connecting portion.

15 Claims, 4 Drawing Sheets

(51) Int. Cl.
*H01L 23/00* (2006.01)
*H05K 1/02* (2006.01)
*H05K 1/11* (2006.01)
*H05K 3/34* (2006.01)

(52) U.S. Cl.
CPC ........ *H01L 23/49866* (2013.01); *H01L 24/48* (2013.01); *H01L 2224/48091* (2013.01); *H01L 2224/48227* (2013.01); *H01L 2924/00014* (2013.01); *H01L 2924/15153* (2013.01); *H01L 2924/15173* (2013.01); *H01L 2924/15174* (2013.01); *H01L 2924/15184* (2013.01); *H01L 2924/15313* (2013.01); *H01L 2924/16195* (2013.01); *H01L 2924/181* (2013.01); *H05K 1/0204* (2013.01); *H05K 1/111* (2013.01); *H05K 3/3436* (2013.01); *H05K 2201/094* (2013.01); *H05K 2201/09781* (2013.01); *H05K 2201/10719* (2013.01); *H05K 2201/10727* (2013.01); *H05K 2203/0465* (2013.01)

(56) References Cited

U.S. PATENT DOCUMENTS

| | | | |
|---|---|---|---|
| 9,301,404 B2 * | 3/2016 | Otsuka | ................ C23C 28/021 |
| 2011/0121463 A1 | 5/2011 | Concepcion | |

* cited by examiner

MOUNTING MEMBER, ELECTRONIC COMPONENT, AND METHOD FOR MANUFACTURING MODULE

BACKGROUND

Field of the Invention

The present technique relates to an external connecting portion of a mounting member.

Description of the Related Art

Japanese Patent Application Laid-Open No. 2007-88190 describes a package for storing high heat dissipation type electronic component, in which the thickness of a first Au plating film coating a lower surface of a terminal unit for bonding with solder to the outside is 0.1 μm or less.

As described in Japanese Patent Application Laid-Open No. 2007-88190, if the thickness of the Au plating film of the terminal unit for bonding with solder is reduced, reliability in the electrical and mechanical bonding between the package and the outside may become insufficient.

SUMMARY

In a technique disclosed herein, a mounting member includes a plurality of internal connecting portions, each of which is electrically connected to an electronic device, and a plurality of external connecting portions, each of which is soldered, wherein the plurality of external connecting portions include a first connecting portion in communication with at least any of the plurality of internal connecting portions, and a second connecting portion other than the first connecting portion, and surfaces of the first connecting portion and the second connecting portion include gold layers, and a thickness of the gold layer of the second connecting portion is smaller than a thickness of the gold layer of the first connecting portion.

Further features of the present invention will become apparent from the following description of exemplary embodiments (with reference to the attached drawings).

DESCRIPTION OF THE EMBODIMENTS

An embodiment according to the present invention will be described below with reference to the drawings. In the following descriptions and drawings, a component common to multiple drawings is denoted by a common code. Therefore, the common component will be described with cross-reference to multiple drawings, and a description of the component denoted by the common code will be omitted accordingly.

Figure 1A:
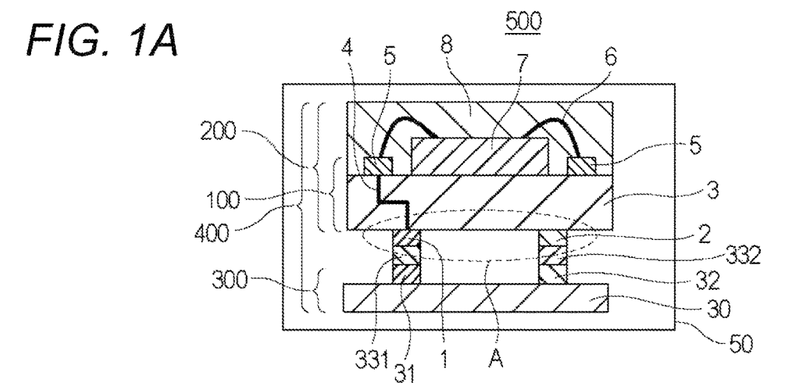
FIGS. 1A to 1C are schematic views illustrating a mounting member.

FIG. 1A is a sectional schematic view of electronic equipment 500 according to the embodiment. The electronic equipment 500 includes a module 400, and a case for storing the module 400. The electronic equipment 500 is an information terminal such as a smartphone, a display apparatus such as a TV set, and an image capturing device such as a camera.

The module 400 includes an electronic component 200, and a wiring member 300 soldered to the electronic component 200 with solders 331 and 332. The solders 331 and 332 are typically tin alloy. The solders are preferably lead-free from the aspect of environment, although a composition thereof is not limited. The wiring member 300 is a printed wiring board in which a substrate 30, e.g. a flexible substrate or a rigid substrate, is used. A surface of the substrate 30 includes connecting portions 31 and 32 soldered to the electronic component 200. The substrate 30 is made of, for example, a material including organic resin such as a composite material of glass epoxy resin or glass polyimide resin. The connecting portions 31 and 32 provided on the surface of the substrate 30 include metal such as copper, gold, aluminum, nickel, and solder. The module 400 can include, for example, a lens unit as a camera module.

The electronic component 200 includes an electronic device 7, a mounting member 100, and a sealing member 8. The mounting member 100 is electrically connected to the electronic device 7 by a connection member 6. The sealing member 8 seals the electronic device 7. The electronic device 7 is typically a semiconductor device and is, for example, a calculation device, a storage device, a display device, an imaging device, or a micro electromechanical system (MEMS). A CCD image sensor and a CMOS image sensor are representative examples of the imaging device. The connection member 6 is a bonding wire in a wire bonding connection and a solder bump in a flip chip connection.

The mounting member 100 includes an external connecting portion group, a substrate 3, a wiring 4, and an internal connecting portion group. The external connecting portion group includes a plurality of external connecting portions including a first external connecting portion 1 and a second external connecting portion 2 other than the first external connecting portion 1. The internal connecting portion group includes a plurality of internal connecting portions including an internal connecting portion 5. Although a detail will be described later, a configuration of the second external connecting portion 2 differs from that of the first external connecting portion 1. The substrate 3 includes, for example, resin, ceramic, and metal. The electronic device 7 is fixed on a surface of the substrate 3 with an adhesive (not illustrated). The internal connecting portion group and the external connecting portion group are exposed on an outer surface of the substrate 3. The internal connecting portion group is provided on an upper surface (front surface) of the substrate 3. Examples of an arrangement type of the external connecting portion group include a land grid array (LGA) type package in which an external connecting portion called a land is arranged on a lower surface (back surface) of the substrate 3, and a leadless chip carrier (LCC) type package in which an external connecting portion is arranged from a side surface over a lower surface (back surface) of the substrate 3.

In the case where the mounting member 100 is mounted on the wiring member 300, the mounting member 100 and the wiring member 300 are prepared. Then, the external connecting portions 1 and 2 are respectively overlapped on the connecting portions 31 and 32 on the wiring member 300, and the external connecting portions 1 and 2 are respectively soldered to the connecting portions 31 and 32. In this manner, the mounting member 100 is electrically and mechanically connected to the wiring member 300.

Examples of a soldering method include a method in which a solder iron is used, and a reflow method. In such methods, the mounting member 100 is surface mounted on the wiring member 300.

The first external connecting portion 1 is in communication with the internal connecting portion 5 through the wiring 4, and the internal connecting portion 5 connected to the first external connecting portion 1 is electrically connected to the electronic device 7 through the connection member 6. Therefore, the first external connecting portion 1 is electrically connected to the electronic device 7, and the first external connecting portion 1 has a function as a connecting portion for securing electrical connection between the outside and the electronic device 7. The electrical connection herein means assuming electrical connection associated with an operation of the electronic device 7 between the wiring member 300 and the electronic device 7. Specifically, examples of the first external connecting portion 1 include a power source terminal supplying a power source voltage to the electronic device 7 and a grounding terminal supplying a grounding voltage to the electronic device 7. Alternatively, examples of the first external connecting portion 1 include an input terminal transmitting an input signal to the electronic device 7 and an output terminal transmitting an output signal from the electronic device 7.

The second external connecting portion 2 has at least a function to improve mechanical connection reliability between the mounting member 100 and the wiring member 300. As described above, this is achieved by a configuration of the second external connecting portion 2, which differs from that of the first external connecting portion 1.

The second external connecting portion 2 may not be electrically connected to the electronic device 7. If the second external connecting portion 2 is not electrically connected to the electronic device 7, it means that at least any of the wiring 4, the internal connecting portion 5, and the connection member 6, which are configured to connect the second external connecting portion 2 to the electronic device 7, is lacking or defective. For example, it is assumed a case where the second external connecting portion 2 is not in communication with any of the plurality of internal connecting portions due to a lack of the wiring 4, or a case where the internal connecting portion 5 in communication with the second external connecting portion 2 is not connected to the electronic device 7 due to a lack of the connection member 6.

Although the second external connecting portion 2 may be electrically connected to the electronic device 7, the second external connecting portion 2 is preferably a grounding terminal in that case. In the case where the second external connecting portion 2 is a grounding terminal, a plurality of grounding terminals are preferably provided for redundancy. As a result, even if each of the grounding terminals has low electrical connection reliability, a ground potential can be sufficiently supplied. On the other hand, a power source terminal, an input terminal, and an output terminal require higher electrical connection reliability than that of a grounding terminal. Also, it is hard to make redundancy in terms of power consumption and a complicated device structure. Therefore, a power source terminal, an input terminal, and an output terminal are preferably the first external connecting portion 1. However, if the first external connecting portion 1 and the second external connecting portion 2 are in communication with a common internal connecting portion (same internal connecting portion) among a plurality of internal connecting portions, a significant issue would not be posed even if an input terminal and an output terminal are the second external connecting portion 2.

The present embodiment focuses on balancing electrical connection reliability (conductivity) and mechanical connection reliability (intensity) in soldering, and therefore, configurations of the first external connecting portion 1 differs from that of the second external connecting portion 2. Differences between the first external connecting portion 1 and the second external connecting portion 2 will be described below in detail.

Figure 1B:
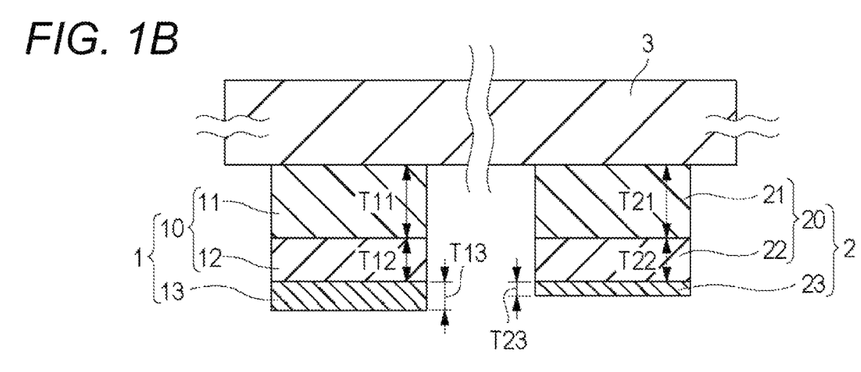

FIG. 1B is an enlarged view of the first external connecting portion 1 and the second external connecting portion 2 of the mounting member 100 or the electronic component 200 before being soldered to the wiring member 300, and corresponding to a portion surrounded by a dotted line A in FIG. 1A.

As illustrated in FIG. 1B, the first external connecting portion 1 includes an electrode 10 and a gold layer 13 coating the electrode 10. A surface of the first external connecting portion 1 includes the gold layer 13. The second external connecting portion 2 includes an electrode 20 and a gold layer 23 coating the electrode 20. A surface of the second external connecting portion 2 includes the gold layer 23. The electrodes 10 and 20 as bases of the gold layers 13 and 23 are not essential. The electrodes 10 and 20 as bases of the gold layers 13 and 23 may not be provided. Instead, the gold layer 13 of the first external connecting portion 1 and the gold layer 23 of the second external connecting portion 2 may be provided in contact with the substrate 3 including an insulating material, thus eliminating the electrodes 10 and 20.

According to the present embodiment, a thickness T13 of the gold layer 23 of the second external connecting portion 2 is smaller than a thickness T13 of the gold layer 13 of the first external connecting portion 1. In the case where the gold layer 13 of the first external connecting portion 1 is thicker than the gold layer of the second external connecting portion 2, it is effective to improve electrical connection reliability of the first external connecting portion. In the case where the gold layer 23 of the second external connecting portion 2 is thinner than the gold layer of the first external connecting portion, it is effective to improve mechanical connection reliability of the second external connecting portion 2. Mechanical connection reliability of the first external connecting portion 1 can be improved by including both of the first external connecting portion 1 and the second external connecting portion 2. As a result, mechanical connection reliability is improved by the second external connecting portion 2 soldered as with the first external connecting portion 1. In this manner, configurations of the electronic component 200 and the module 400 are less complicated in comparison with a case of improving mechanical connection reliability by a configuration entirely different from that of the first external connecting portion 1. Also, mechanical connection reliability can be improved by soldering in the second external connecting portion 2 in conjunction with soldering in the first external connecting portion 1. As a result, the electronic component 200 and the module 400 can be more simply manufactured in comparison with a case of improving mechanical connection reliability by a process entirely different from soldering in the first external connecting portion 1.

The thickness T13 of the gold layer 13 of the first external connecting portion 1 is preferably 0.3 μm or more, and more preferably 0.5 μm or more. Also, the thickness T13 is preferably 1.0 μm or less. The thickness T23 of the gold layer 23 of the second external connecting portion 2 is preferably 0.1 µm or more. If the thickness T23 of the gold layer 23 of the second external connecting portion 2 is less than 0.1 µm, solder wettability becomes insufficient, and sufficient soldering strength may not be obtained. Also, the thickness T23 is preferably 0.5 µm or less and more preferably 0.4 µm or less. A difference between the thickness T13 of the gold layer 13 of the first external connecting portion 1 and the thickness T23 of the gold layer 23 of the second external connecting portion 2 is preferably 0.10 µm or more.

A surface of the internal connecting portion 5 can also include a gold layer. A thickness of the gold layer of the surface of the internal connecting portion 5 is preferably 0.3 µm or more and preferably 1.0 µm or less. If the thickness of the gold layer of the surface of the internal connecting portion 5 is less than 0.3 µm, connection reliability in the connection member 6 such as a bonding wire may become insufficient. If the gold layer of the surface of the internal connecting portion 5 is thick, a cost increases. Therefore, the thickness of the gold layer of the surface of the internal connecting portion 5 is preferably 1.0 µm or less.

The electrodes 10 and 20 which are bases of the gold layers 13 and 23 are conductive films such as metal films. The electrode 10 according to the present embodiment is a multiple layer film including a first conductive layer 11 having a thickness T11 and a second conductive layer 12 having a thickness T12. The electrode is a multiple layer film including a first conductive layer 21 having a thickness T21 and a second conductive layer 22 having a thickness T22. However, the electrodes 10 and 20 may be single layer films. The first conductive layers 11 and 21 are disposed between the substrate 3 and the second conductive layers 12 and 22, respectively. Nickel, copper, and tungsten are preferably used as materials of conductive layers of the electrodes 10 and 20. In the present embodiment, the first conductive layers 11 and 21 are tungsten layers, and the second conductive layers 12 and 22 are nickel layers. The tungsten layers can be formed by metallization on a ceramic surface in which applying tungsten paste to a ceramic (green sheet) before burning and then burning the ceramic. The nickel layers as the second conductive layers 12 and 22 can be formed by performing nickel plating processing to the tungsten layers as the first conductive layers 11 and 21. In the first external connecting portion 1, thicknesses are typically $T13<T12<T11$. In the second external connecting portion 2, thicknesses are typically $T23<T22<T21$. T11 may be equal to T21, and T12 may be equal to T22. For example, thicknesses of the tungsten layers as the first conductive layers 11 and 21 are 5 µm or more and 20 µm or less. Thicknesses of the nickel layers as the second conductive layers 12 and 22 are 1 µm or more and 9 µm or less.

A conventionally known method can be selectively used for a method for forming a gold layer. For example, the gold layer can be formed by performing gold plating processing on surfaces of the electrodes 10 and 20 which serve as bases. A preferable method is an electrolytic plating method in which gold layers are formed by applying current to metal layers of the electrodes 10 and 20, which serve as bases, in a plating solution; or an electroless plating method in which gold is deposited on a surface of a metal layer of a base by adding a reductant to a plating solution. A method for forming the gold layers 13 and 23 is not limited to gold plating processing. The gold layers 13 and 23 can be formed by vapor deposition or sputtering.

For example, a following manufacturing process may be applied to vary thicknesses of the gold layer 13 of the first external connecting portion 1 and the gold layer 23 of the second external connecting portion 2. First, gold metal processing is performed on a surface of the electrode 10 of the first external connecting portion 1 after a photoresist film is formed on the electrode 20 of the second external connecting portion 2. Gold plating processing is further performed on the surface of the electrode 10 of the first external connecting portion 1 and the surface of the electrode 20 of the second external connecting portion 2 after the photoresist film is peeled off. As a result, the gold layer 13 of the first external connecting portion 1 becomes thicker than the gold layer 23 of the second external connecting portion 2.

Alternatively, if an electrolytic plating method is used, the thickness of a gold layer formed on an electrode can be changed by lowering a density of current passing through the second external connecting portion 2 in comparison with a density of current passing through the first external connecting portion 1 while electrolytic plating processing is performed. Examples of a method for controlling a current density include a method in which the wirings 4 provided in the mounting member 100 are connected to the first external connecting portion 1 and the second external connecting portion 2 on different systems, and also a method in which a resistance of the wiring 4 connected to the first external connecting portion 1 is made different from a resistance of the wiring 4 connected to the second external connecting portion 2. When such methods are used, the second external connecting portion 2 as well as the first external connecting portion 1 is preferably in communication with any of a plurality of internal connecting portions through the wiring 4.

The thickness of a gold layer of the internal connecting portion 5 is preferably equal to one of the thickness T13 of the gold layer 13 of the first external connecting portion 1 and the thickness T23 of the gold layer 23 of the second external connecting portion 2. If the thickness of the gold layer of the internal connecting portion 5 is equal to the thickness of one of the gold layers of the external connecting portions, gold plating processing can be performed to an internal connecting portion and an external connecting portion in a single process. Therefore, a manufacturing process can be simplified and a manufacturing cost can be reduced. As described above, the internal connecting portion 5 is preferably relatively thick, and thus the thickness of the gold layer of the internal connecting portion 5 is preferably equal to the thickness T13 of the gold layer 13 of the first external connecting portion 1. Therefore, the thickness of the gold layer of the internal connecting portion 5 is preferably larger than the thickness T23 of the gold layer 23 of the second external connecting portion 2.

Figure 1C:
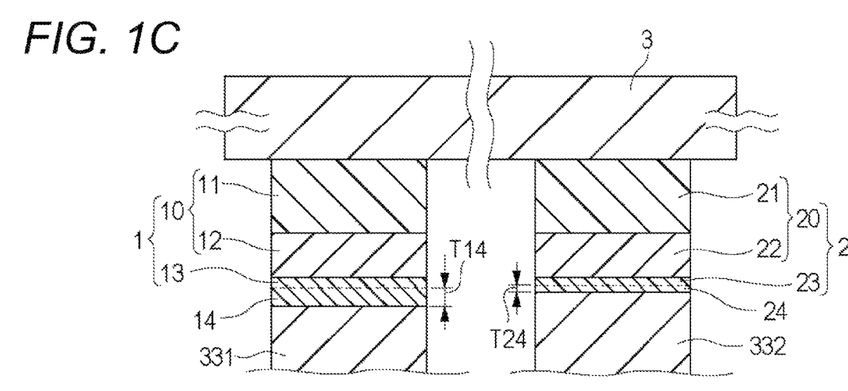

FIG. 1C is an enlarged view of the first external connecting portion 1 and the second external connecting portion 2 of the mounting member 100 or the electronic component 200 after being soldered to the wiring member 300 by the solders 331 and 321, and corresponding to a portion surrounded by a dotted line A in FIG. 1A.

When the gold layers 13 and 23 come into contact with the solders 331 and 332, respectively, for soldering, gold in the gold layers 13 and 23 diffuses and becomes solid solution in the solders 331 and 332. Such a phenomenon is called gold leaching during soldering. FIG. 1C illustrates a diffusion region 14 formed between the solder 331 and the electrode 10 after gold in the gold layer 13 has diffused. Also, FIG. 1C illustrates a diffusion region 24 formed between the solder 332 and the electrode 20 after gold in the gold layer 23 has diffused. Gold layers 130 and 230 are illustrated between the diffusion regions 14 and 24 and the electrodes 10 and 20, respectively. The gold layers 130 and 230 have thicknesses which have become smaller, as a result of diffusion, than those of the gold layers 13 and 23 before soldering, which are illustrated in FIG. 1B. The thicknesses of the gold layers 130 and 230 are reduced in comparison with the thicknesses T13 and T23 of the gold layers 13 and 23, respectively. However, depending on the thicknesses of the gold layers 13 and 23, all of gold in the gold layers 13 and 23 diffuses in the solders 331 and 332, respectively, and the gold layers 13 and 23 may completely dissolve. In other words, the diffusion regions 14 and 24 may come into contact with the electrodes 10 and 20, respectively.

Herein, thicknesses of the diffusion regions 14 and 24 are denoted by T14 and T24, respectively. The thicknesses of the diffusion regions 14 and 24 are directly proportional to an amount of gold being supplied. More specifically, as the thicknesses T13 and T23 of the gold layers 13 and 23 before soldering increase, the thicknesses T14 and T24 of the diffusion regions 14 and 24 increase. Mechanical strength of the diffusion regions 14 and 24 is lower than that of the gold layers 130 and 230. Therefore, as the thicknesses T14 and T24 of the diffusion regions 14 and 24 increase, mechanical connection reliability in soldering decreases.

For example, in the case where thermal expansion coefficient of the mounting member 100 differ from that of the wiring member 300, the diffusion regions 14 and 24 located between the mounting member 100 and the wiring member 300 are stressed as a result of temperature cycling. The stress may cause a fracture (crack) may occur respectively between the diffusion regions 14 and 24 and the electrodes 10 and 20. Avoiding such a fracture leads to improvement of mechanical connection reliability. Especially LGA-type or LCC-type mounting member 100 tends to be weak against such a thermal stress because thicknesses of formed solders 331 and 332 are small.

In the present embodiment, T13 is larger than T23, and thus T14 is larger than T24. Therefore, the second external connecting portion 2 has higher mechanical connection reliability than that of the first external connecting portion 1.

On the other hand, the smaller the thicknesses T13 and T23 of the gold layers 13 and 23 are, the more solder wettability on a surface of an external connecting portion decreases, and accordingly electrical connection reliability in soldering decreases. The solder wettability is more likely to decrease when the thickness of a gold layer is less than 0.3 μm, and the solder wettability remarkably decreases when the thickness is less than 0.1 μm. Therefore, the thickness T13 of the gold layer 13 of the first external connecting portion 1 in charge of electrical connection is preferably 0.3 μm or more. The thickness T23 of the gold layer 23 of the second external connecting portion 2 in charge of mechanical connection is enough to be 0.1 μm or more, and may be less than 0.5 μm.

Also, when the electronic component 200 is manufactured, electrical characteristics may be inspected by pressing a probe pin against an external connecting portion. The smaller the thicknesses T13 and T23 of the gold layers 13 and 23 on a surface of the external connecting portion, the more likely the electrodes 10 and 20, which serve as bases, are exposed because the gold layers fall off or are peeled due to contact with the probe pin. If the electrodes 10 and 20 are exposed, a failure in contact with the probe pin and defective soldering may occur. The electrodes, which serve as bases, are remarkably exposed when the thicknesses of the gold layers are less than 0.3 μm. Therefore, the thickness T13 of the gold layer 13 of the first external connecting portion 1 in charge of electrical connection is preferably 0.3 μm or more.

In the present embodiment, electrical connection reliability can be improved by increasing the thickness of the gold layer 13 of the first external connecting portion 1 connected to the electronic device 7 in comparison with that of the gold layer 23 of the second external connecting portion 2. On the other hand, the second external connecting portion 2, which has lower electrical reliability than that of the first external connecting portion 1, may not be connected to the electronic device 7 or may be a grounding connecting portion. In this manner, both of electrical connection reliability and mechanical connection reliability of the mounting member 100, the electronic component 200, or the module 400 are assured.

Respective interactions between the gold layers 13 and 23 and the solders 331 and 332, which have been described above, are phenomena which can occur regardless of materials of the electrodes 10 and 20 in the connecting portion and of compositions of the solders 331 and 332. Therefore, in the present embodiment, materials and compositions of the electrodes and the solders are not specifically limited.

Specific arrangement of the first external connecting portion 1 and the second external connecting portion 2 in a plurality of external connecting portions will be described below.

Figure 2A:
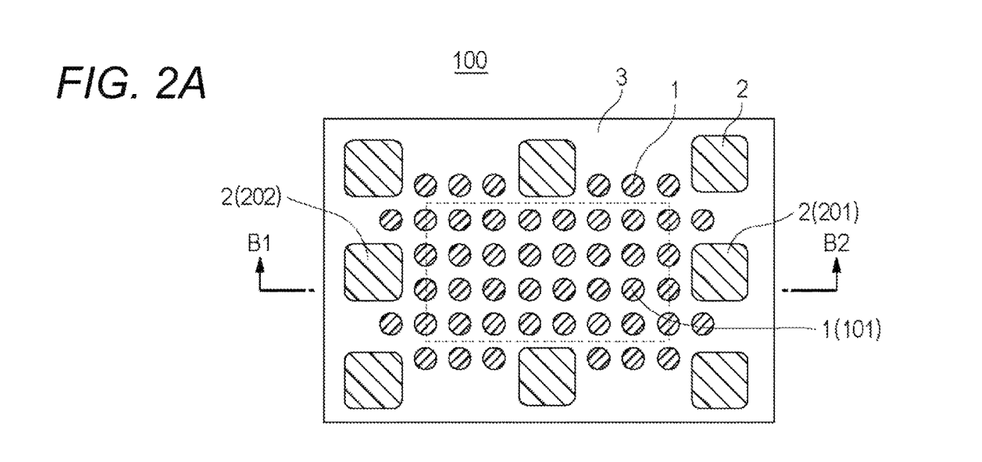
FIGS. 2A to 2C are schematic views illustrating a mounting member.
Figure 2B:
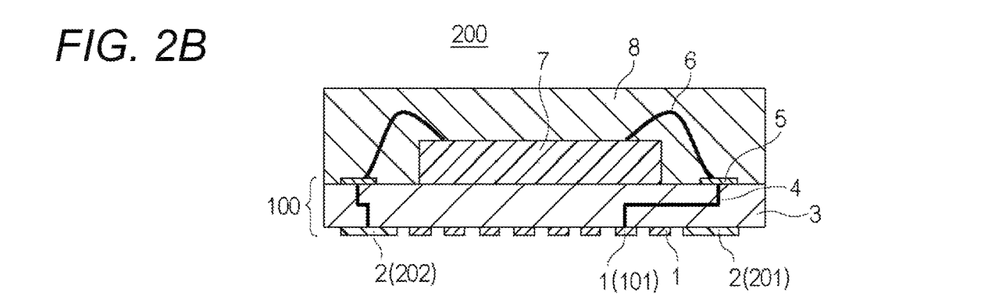
Figure 2C:
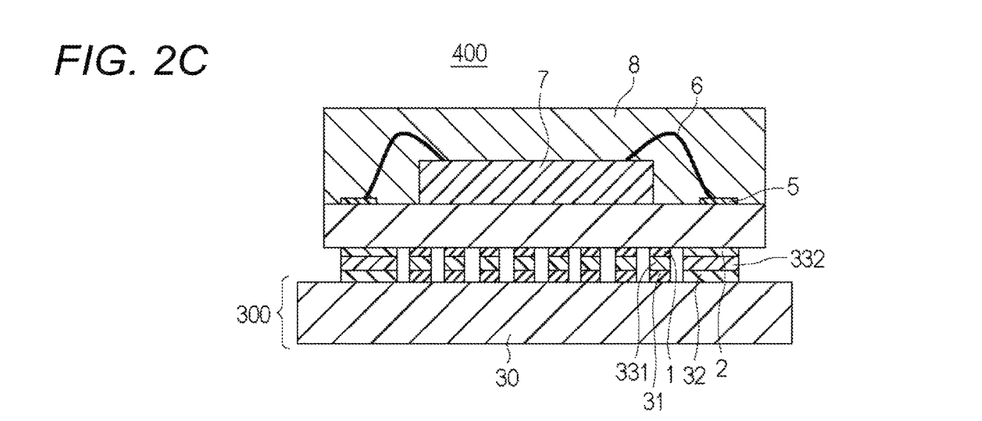

FIG. 2A is a schematic plan view of a lower surface of an electronic component including the LGA-type mounting member 100. FIG. 2B is a schematic view of a section taken along line B1-B2 of FIG. 2A. FIG. 2C is a sectional schematic view of the module 400 in which the electronic component 200 illustrated in FIG. 2B is soldered to the wiring member 300 with the solders 331 and 332.

In FIGS. 2A and 2B, a plurality of external connecting portions are illustrated by separately hatching the first external connecting portion 1 and the second external connecting portion 2 depending on the thickness of a gold layer. In the plurality of external connecting portions, a dummy connecting portion 201, which is not connected to the electronic device 7, is included as the second external connecting portion 2. Also, in the plurality of external connecting portions, a grounding terminal 202, which is connected to the electronic device 7, is included as the second external connecting portion 2. A surface area of the second external connecting portion 2 is larger than that of the first external connecting portion 1. The second external connecting portion 2 can withstand a stress caused by a heat stress in a solder bonding portion and alleviate a stress to the solder bonding portion in the first external connecting portion 1 in the vicinity of the second external connecting portion 2. The stress to the solder bonding portion in the first external connecting portion 1 can be effectively alleviated by increasing the surface area of the second external connecting portion 2 in comparison with that of the first external connecting portion 1.

A plane shape of the second external connecting portion 2 is not limited. The shape may be or may not be similar to that of the first external connecting portion 1. For example, while the plane shape of the first external connecting portion 1 is a circle or a quadrangle, the plane shape of the second external connecting portion 2 may be an I-shape or an L-shape.

The plurality of external connecting portions are preferably arranged so that a distance from the second external connecting portion 2 to an outer edge (side surface) of the mounting member 100 is smaller than a distance from the first external connecting portion 1 to the outer edge (side surface) of the mounting member 100. Furthermore, the first external connecting portion 1 is preferably not arranged between the second external connecting portion 2 and a part closest to the second external connecting portion 2 in the outer edge of the mounting member 100.

A stress caused by a difference in thermal expansion of the wiring member 300 and that of the electronic component 200 depends on a distance from a center of the electronic component 200 in the solder bonding portion. The maximum stress occurs in the solder bonding portion located farthest from the center. Therefore, electrical connection reliability and mechanical connection reliability can be further improved by arranging the second external connecting portion 2, not the first external connecting portion 1, in a peripheral region located outer than the central region.

An intermediate value TM between the thickness T13 of the gold layer 13 of the first external connecting portion 1 and the thickness T23 of the gold layer 23 of the second external connecting portion 2, i.e., TM=(T13+T23)/2, can be taken as a standard (baseline) of thicknesses of gold layers of a plurality of external connecting portions. Among a plurality of external connecting portions, an external connecting portion, of which thickness of a gold layer is the intermediate value TM or more, is called a type-1 external connecting portion; and an external connecting portion, of which thickness of a gold layer is less than the intermediate value TM, is called a type-2 external connecting portion. The first external connecting portion 1 is classified into the type-1 external connecting portion. The second external connecting portion 2 is classified into the type-2 external connecting portion. In the drawings (FIGS. 2A to 4C) described below, the type-1 external connecting portion is indicated by the same hatching pattern as that of portions indicated as the first external connecting portion 1. The type-2 external connecting portion is indicated by the same hatching pattern as that of portions indicated as the second external connecting portion 2.

In all external connecting portions, a number of the type-1 external connecting portion is preferably larger than a number of the type-2 external connecting portion. Also, the thicknesses of gold layers of all type-1 external connecting portions are preferably the same, and the thicknesses of gold layers of all type-2 external connecting portions are preferably the same.

Surface areas of all type-1 external connecting portions may be the same. Alternatively, surface areas of external connecting portions of a part of the type-1 external connecting portions may differ from surface areas of external connecting portions of the other part of the type-1 external connecting portions. Surface areas of all type-2 external connecting portions may be the same. Alternatively, surface areas of external connecting portions of a part of the type-2 external connecting portion may differ from surface areas of external connecting portions of the other part of the type-2 external connecting portion. The surface areas of all type-2 external connecting portions are preferably smaller than the surface areas of all type-1 external connecting portions.

Also, all of the type-2 external connecting portions are preferably disposed closer to an outer edge of the mounting member 100 than all of the type-1 external connecting portions. Shapes of all type-1 external connecting portions may be or may not be the same. Shapes of all type-2 external connecting portions may be or may not be the same.

Figure 3A:
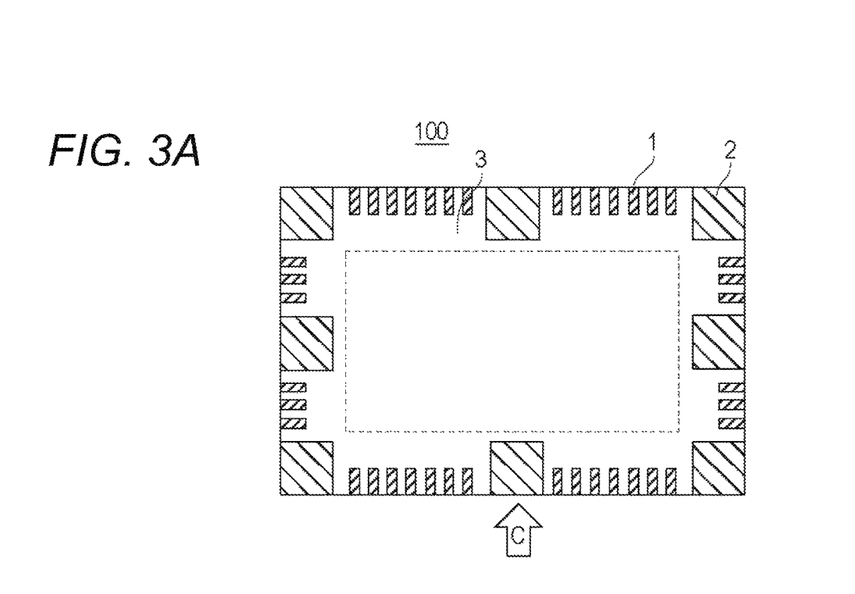
FIGS. 3A to 3C are schematic views illustrating a mounting member.
Figure 3B:
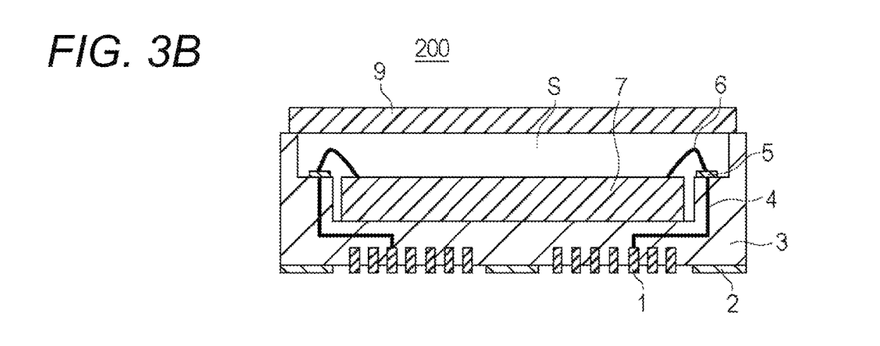
Figure 3C:
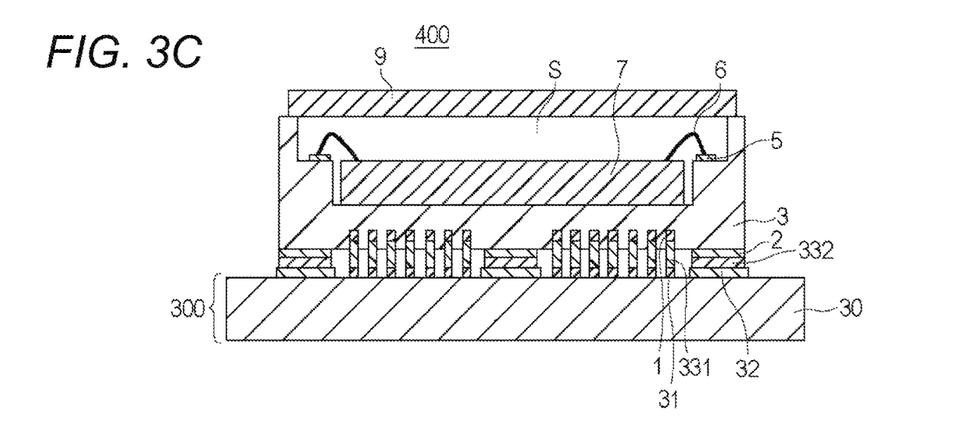

FIG. 3A is a schematic plan view of a lower surface of an electronic component including the LCC-type mounting member 100. FIG. 3B is a schematic plan view of a side surface viewed from a direction C in FIG. 3A. FIG. 3C is a sectional schematic view of the module 400 in which the electronic component 200 illustrated in FIG. 3B is soldered to the wiring member 300 with the solders 331 and 332.

In the LCC-type mounting member 100, the first external connecting portion 1 is disposed so as to extend from a back side to a side surface of the mounting member 100. Therefore, the first external connecting portion 1 is disposed along an outer edge of the mounting member 100. In this case, the second external connecting portion 2 is preferably disposed along the outer edge of the mounting member 100 as with the first external connecting portion 1. In the present embodiment, the second external connecting portion 2 provided on the back side of the mounting member 100 does not extend to the side surface of the mounting member 100. However, as well as the first external connecting portion 1, the second external connecting portion 2 preferably extends to the side surface of the mounting member 100.

Although FIGS. 2B and 2C illustrate an example in which the substrate 3 of the mounting member 100 is a flat plate member, the substrate 3 of the mounting member 100 may be a recessed member including a frame surrounding the electronic device 7 as illustrated in FIGS. 3B and 3C. After the electronic device 7 is stored in a recess of the substrate 3 as a recessed member, the frame of the substrate 3 may have a cover member 9 opposing the electronic device 7 through a space S. In the case where the electronic device 7 is an image capturing device or a display device, a transparent plate made of plastic, glass or crystal is used for the cover member 9.

Figure 4A:
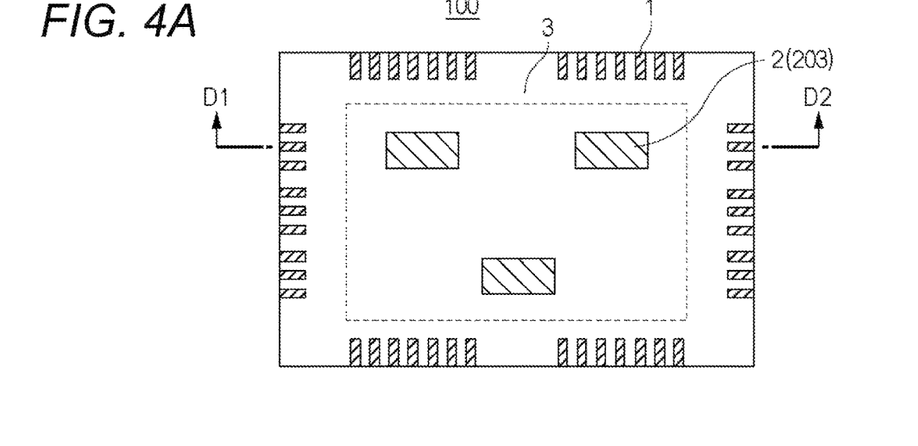
FIGS. 4A to 4C are schematic views illustrating a mounting member.
Figure 4B:
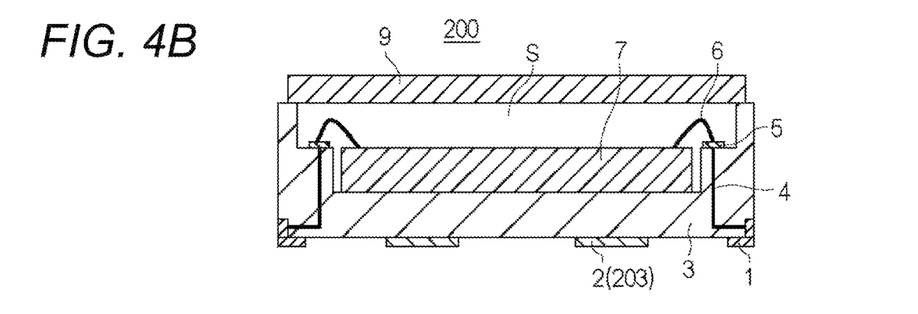
Figure 4C:
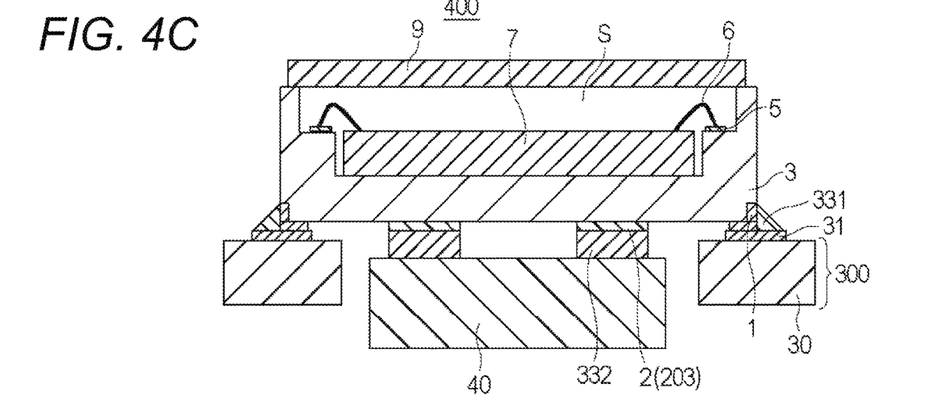

FIG. 4A is a schematic plan view of a lower surface of an electronic component including the LCC-type mounting member 100. FIG. 4B is a schematic view of a section taken along line D1-D2 illustrated in FIG. 4A. FIG. 4C is a sectional schematic view of the module 400 in which the electronic component 200 illustrated in FIG. 4B is soldered to the wiring member 300 with the solders 331 and 332.

FIGS. 4A to 4C differ from FIGS. 2A to 2C and FIGS. 3A to 3C in that the second external connecting portion 2 is located in a region overlapping with the electronic device 7 in a direction perpendicular to a main surface of the electronic device 7. The region overlapping with the electronic device 7 is easily affected by temperature cycling due to a difference between temperatures while the electronic device 7 is used and while the electronic device 7 is not used. Therefore, high soldering reliability is required for an external connecting portion disposed in the region. To satisfy this requirement, mechanical connection reliability with a member to be soldered can be improved by providing the second external connecting portion 2 in a region corresponding to the electronic device 7.

Furthermore, in the present embodiment, the second external connecting portion 2 functions as a heat dissipation unit 203 configured to dissipate heat generated at the electronic device 7 to the outside. In this manner, the second external connecting portion 2 can improve reliability in thermal connection. Heat can be effectively dissipated by providing the heat dissipation unit 203 in the region overlapping with the electronic device 7. As illustrated in FIG. 4C, the heat dissipation unit 203 is soldered to the heat dissipation member 40 which is other member than the wiring member 300 soldered to the first external connecting portion 1. In the present embodiment, the heat dissipation member 40 includes a material having high heat conductivity such as metal. For example, a heat conductivity of the heat dissipation member 40 is preferably higher than that of the substrate 30 of the wiring member 300. The heat dissipation member 40 can dissipate heat generated at the electronic device 7 to the outside through the heat dissipation unit 203 and the solder 332, and can suppress overheating of the electronic device 7.

Herein, the heat dissipation member 40 is illustrated as an example of a member other than the wiring member 300 and connected to the second external connecting portion 2 overlapping with the electronic device 7. However, in a simple manner, a fixed member for firmly fixing the electronic component 200 may be soldered to the second external connecting portion 2 under the electronic device 7.

The LCC-type mounting member 100 is used in the examples in FIGS. 4A to 4C. Therefore, the first external connecting portion 1 is located in a region not overlapping with the electronic device 7 in a direction perpendicular to a main surface of the electronic device 7. However, in the case where the LGA-type mounting member 100 is used as in FIGS. 3A to 3C, both of the first external connecting portion 1 and the second external connecting portion 2 may be located in a region overlapping with the electronic device 7 in a direction perpendicular to the main surface of the electronic device 7. Although, in the examples, the first external connecting portion 1 is located closer to an outer edge of the mounting member 100 than the second external connecting portion 2, the second external connecting portion 2 located in the region overlapping with the electronic device 7 can be extended to a side surface of the mounting member 100. Also, in the examples, three type-2 external connecting portions are arranged in the region overlapping with the electronic device 7. However, just one larger type-2 external connecting portion may be disposed.

Example

A module 400 illustrated in FIG. 2C has been manufactured. A manufacturing method will be described below with reference to FIGS. 1A to 1C and FIGS. 2A to 2C.

An alumina ceramic material, of which coefficient of thermal expansion has been 7 ppm/° C., has been used as a substrate 3. A mounting member 100 has been manufactured to include an internal connecting portion 5 as a connecting portion for wire bonding, an internal wiring 4, and an electrode 10 of a first external connecting portion 1 and an electrode 20 of a second external connecting portion 2 on a bottom surface.

Specifically, first, tungsten paste has been formed by a printing method on a surface of a green sheet using the above as a precursor of the substrate 3, and then the substrate 3 and tungsten layers as first conductive layers 11 and 21 have been formed by burning at 900° C. A size of the substrate 3 is 25 mm long×35 mm wide×0.8 mm thick.

Herein, the internal connecting portion 5 and the first external connecting portion 1 have been electrically communicated by the wiring 4 in the substrate 3, and the second external connecting portion 2 has not been connected to any of the plurality of internal connecting portions.

Next, nickel layers having a 5 µm thickness has been formed by electroless nickel plating as second conductive layers 12 and 22 on the tungsten layers of the internal connecting portion 5, the first external connecting portion 1, and the second external connecting portion 2.

Electroless nickel plating processing has been performed for forming a 0.3 µm gold plating layer after forming a resist film on the second external connecting portion 2. Then, electroless nickel plating processing has been performed for forming a 0.2 µm gold plating layer after removing the resist film. As a result, a 0.5 µm gold plating layer (gold layer 13) has been formed on the nickel layer of the electrode 10 of the first external connecting portion 1 and the nickel layer of an electrode of the internal connecting portion 5. Also, a 0.3 µm gold plating layer (gold layer 23) has been formed on the nickel layer of the electrode 20 of the second external connecting portion 2.

An electronic device 7, which is a CMOS image sensor, has been bonded with die bonding paste (not illustrated) on the substrate 3. A connection pad of the electronic device 7 and the internal connecting portion 5 have been bonded with a bonding wire as a connection member 6. In this manner, an electronic component 200 has been manufactured. Electric characteristics of the manufactured electronic component 200 have been inspected by pressing a probe pin against the first external connecting portion 1.

On the other hand, as a wiring member 300, a printed wiring board has been prepared, in which connecting portions 31 and 32 including copper, nickel, and gold are formed on a surface of the substrate 30 made of glass epoxy having a coefficient of thermal expansion of 15 ppm/° C.

After solder paste has been applied by screen printing to connecting portions 31 and 32 of the printed wiring board, positions of the connecting portions 31 and 32 on the printed wiring board and positions of the first external connecting portion 1 and the second external connecting portion 2 of the electronic component 200 have been respectively adjusted. After the solder paste has been heated and melted (reflow), the first external connecting portion 1 and the second external connecting portion 2 of the electronic component 200 have been respectively soldered with the solders 331 and 332 having a 0.2 mm thickness to the connecting portions 31 and 32 of the printed wiring board. In this manner, the module 400 has been manufactured. Tin-bismuth (Sn—Bi) based lead-free solder has been used for the solders 331 and 332.

Ten modules 400 have been manufactured, and each of the modules has been subjected to a temperature cycle test for 1,000 cycles. In one cycle, each of the test samples has been stored, for 10 minutes, in a constant temperature oven in which a temperature has been controlled at −25° C. and 125° C. Then, a resistance between the printed wiring board and the first external connecting portion 1 of the electronic component 200 has been measured before and after the test.

Also, a soldering state of the module 400 has been monitored before and after the test by using an X-ray inspection apparatus.

As a result, resistances of all of the ten modules 400 used in the example have not changed after 1,000 cycles. Also, any defects such as a crack or a fracture have been found at solder bonding portions before and after the test.

Comparative Example

Ten modules for comparison have been manufactured in the same manner as that of the example, except that a gold plating layer of the first external connecting portion in the example has been changed to be 0.3 µm thick as with the second external connecting portion 2.

The ten modules for comparison have been subjected to the same temperature cycle test as the example to evaluate resistances. Also, a soldering state has been monitored by an X-ray inspection apparatus.

As a result, it has been found that resistances before the temperature cycle test has been relatively higher in comparison with the example. As a result of the monitoring by the X-ray inspection apparatus, it has been found that a part of the connecting portion has not been bonded with solder in the solder bonding portion of the first external connecting portion because solder has not got wet and spread on a whole surface of the first external connecting portion when solder paste has been heated and melted.

Furthermore, when electric characteristics of the electronic component for comparison have been inspected by pressing a prove pin against the first external connecting portion, a gold plating layer on a surface of the first external connecting portion has been fallen, and a failure in contact with the prove pin has sometimes occurred.

As can be seen from the above results, in the electronic component and the module in which the electronic component is soldered to the printed wiring board according to the embodiment of the present invention, the second external connecting portion has a thin gold plating layer. Therefore, an electronic component and a module, of which solder bonding portions do not fracture due to a thermal stress such as temperature cycling, can be obtained by improving junction reliability between a printed wiring board and an electrode connecting portion of the electronic component.

On the other hand, the thickness of a gold plating layer of a first external connecting portion connected to a semiconductor element is thick. Therefore, stable junction can be formed by improving solder wettability on a surface of a connecting portion while soldering to a printed wiring board, without impairing performance of the semiconductor element. Also, a failure in contact with a probe pin can be suppressed without peeling off a gold plating layer during an electric inspection by the probe pin.

The embodiment described above can be accordingly modified and combined without departing from the scope of the concept of the invention. Commonly or publicly known techniques in such a technical field can be applied as to a portion which is not illustrated and described herein.

According to the present invention, a mounting member capable of improving electrical and mechanical reliability in solder bonding connected to the outside can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-043113, filed Mar. 5, 2014, which is hereby incorporated by reference herein in its entirety.

What is claimed is:

1. A mounting member comprising:
   a substrate having an upper surface and a lower surface opposite to the upper surface, an electronic device being provided on the upper surface;
   a plurality of internal connecting portions provided on the upper surface, each configured to be electrically connected to the electronic device; and
   a plurality of external connecting portions provided on the lower surface, each configured to be soldered, wherein
   the plurality of external connecting portions include a first connecting portion electrically connected to at least one of the plurality of internal connecting portions, and a second connecting portion, and
   a first surface of the first connecting portion and a second surface of the second connecting portion include gold layers, and a thickness of the gold layer of the second surface is less than a thickness of the gold layer of the first surface.

2. The mounting member according to claim 1, wherein the thickness of the gold layer of the second surface is 0.1 µm or more and 0.5 µm or less.

3. The mounting member according to claim 1, wherein the thickness of the gold layer of the first surface is 0.3 µm or more and 1.0 µm or less.

4. The mounting member according to claim 1, wherein the second connecting portion is not electrically connected to any of the plurality of internal connecting portions.

5. The mounting member according to claim 1, wherein an area of the surface of the second surface is larger than an area of the surface of the first surface.

6. The mounting member according to claim 1, wherein, taking an intermediate value between the thickness of the gold layer of the first surface and the thickness of the gold layer of the second surface as a standard, among the plurality of external connecting portions, a number of external connecting portions, of which surfaces include gold layers having a thickness less than the intermediate value, is larger than a number of external connecting portions, of which surfaces include gold layers having a thickness equal to or more than the intermediate value.

7. The mounting member according to claim 1, wherein a distance from the second connecting portion to an outer edge of the mounting member is less than a distance from the first connecting portion to the outer edge of the mounting member.

8. The mounting member according to claim 1, wherein the plurality of internal connecting portions include an internal connecting portion electrically connected to the first connecting portion, a surface of the internal connecting portion includes a gold layer, and a thickness of the gold layer of the internal connecting portion is greater than a thickness of the gold layer of the second connecting portion.

9. An electronic component comprising:
   the mounting member according to claim 1; and
   an electronic device fixed to the mounting member and electrically connected to the plurality of internal connecting portions.

10. The electronic component according to claim 9, wherein the second connecting portion is not electrically connected to the electronic device, or the second connecting portion is a ground connecting portion electrically connected to the electronic device.

11. The electronic component according to claim 9, wherein the second connecting portion is located in a region overlapping with the electronic device in a direction perpendicular to a main surface of the electronic device.

12. A method for manufacturing a module, comprising:
   preparing the electronic component according to claim 9; and
   soldering the first and second connecting portions to wiring members.

13. A method for manufacturing a module, comprising:
   preparing the electronic component according to claim 9;
   soldering the first connecting portion to a wiring member; and
   soldering the second connecting portion to a member other than the wiring member.

14. The mounting member according to claim 1, wherein the first connecting portion and the second connecting portion are provided adjacent to each other in plain view.

15. The mounting member according to claim 1, wherein, in the first connecting portion, the first surface is provided at a distant position in relation to the lower surface, and in the second connecting portion, the second surface is provided at a distant position in relation to the lower surface.

* * * * *